United States Patent
Baumgartner et al.

(10) Patent No.: US 6,993,734 B2
(45) Date of Patent: Jan. 31, 2006

(54) USE OF TIME STEP INFORMATION IN A DESIGN VERIFICATION SYSTEM

(75) Inventors: Jason Raymond Baumgartner, Austin, TX (US); Hari Mony, Austin, TX (US); Viresh Paruthi, Austin, TX (US); Mark Allen Williams, Plesant Valley, NY (US)

(73) Assignee: International Business Machines Corporatioin, Armonk, NY (US)

( * ) Notice: Subject to any disclaimer, the term of this patent is extended or adjusted under 35 U.S.C. 154(b) by 300 days.

(21) Appl. No.: 10/371,002

(22) Filed: Feb. 20, 2003

(65) Prior Publication Data

US 2004/0168137 A1 Aug. 26, 2004

(51) Int. Cl.
*G06F 17/50* (2006.01)
*G06F 9/45* (2006.01)

(52) U.S. Cl. .................................. 716/4; 716/6; 703/13; 703/19

(58) Field of Classification Search ................. 716/1–6; 703/13–17, 19, 20, 22

See application file for complete search history.

(56) References Cited

U.S. PATENT DOCUMENTS

| 5,680,332 A | * | 10/1997 | Raimi et al. ................... 703/13 |
| 5,987,243 A | * | 11/1999 | Aihara ......................... 703/17 |
| 6,102,959 A | * | 8/2000 | Hardin et al. .................. 703/2 |
| 6,370,494 B1 | * | 4/2002 | Mizuno et al. ................ 703/17 |
| 6,698,003 B2 | * | 2/2004 | Baumgartner et al. ......... 716/4 |
| 2002/0133325 A1 | * | 9/2002 | Hoare et al. .................. 703/17 |
| 2003/0154063 A1 | * | 8/2003 | Lu et al. ....................... 703/14 |
| 2004/0123254 A1 | * | 6/2004 | Geist et al. .................... 716/4 |

\* cited by examiner

*Primary Examiner*—Leigh M. Garbowski
(74) *Attorney, Agent, or Firm*—Joseph P. Lally; Casimer K. Salys (57) ABSTRACT

The disclosed design verification system includes a verification engine to model the operation of an integrated circuit and to assess the model's adherence to a property during N time steps of its operation. The value of N is recorded and propagated. The propagated value of N is used to reduce resources expended during subsequent analysis of the integrated circuit by ignoring the model's adherence to the property during the early stages of subsequent analysis (during time steps less than N). The system may include a diameter estimator that identifies a value of N beyond which subsequent modeling of the integrated circuit produces no new states. Property checking is ignored during states having a time step value greater than the estimated diameter.

16 Claims, 4 Drawing Sheets

USE OF TIME STEP INFORMATION IN A DESIGN VERIFICATION SYSTEM

BACKGROUND

1. Field of the Present Invention

The present invention relates to the field of integrated circuit design and more particularly to the field of integrated circuit design verification systems.

2. History of Related Art

As the complexity of microprocessors and other complex integrated circuits has increased over the years, the resources devoted to design verification have accounted for an increasingly large percentage of the total resources required to develop and manufacture such a device. Indeed, verifying advanced microprocessors having multiprocessing capability is now estimated to consume more time, labor, and other resources than the actual designing of the device.

Historically, functional verification consisted primarily of generating large numbers of test programs or test cases and running those test programs on a simulator that modeled the device operation. Designers and verification engineers frequently developed such test cases manually with the help of various random and specific test generators. As the number of transistors, functions, registers, and other facilities in the integrated circuit has increased, conventional verification methods have responded by simply increasing the number of tests that are simulated. Unfortunately, generating a seemingly infinite number of tests is an inefficient and unreliable method of verifying the functionality of all components in a complex circuit.

In the early days of microprocessor development, inefficiencies in functional verification were tolerated because the size of the test space (measured, for example, by the number of states the microprocessor may assume) was sufficiently small. In addition, early microprocessors typically had fewer functional units than modern microprocessors, and the interactions between the components and functions were well understood and controlled. The increasing number of functional units in microprocessors is significant from a verification perspective because interaction between functional units can no longer be ignored or only loosely verified by conventional verification methodologies.

The diverse applications in which modern integrated circuits are employed makes it impossible to predict and plan for the type of software applications that will run on them and thus the state and interdependence that will be exercised in the field are rather large and generally non-deterministic. Roughly speaking, the test space of a microprocessor is approximately equal to $2^n$ where n represents the number of latches (state storage devices) within the microprocessor. From this approximation, it will be appreciated that the test space of microprocessors increases exponentially as the number of latches is increased.

The conventional approach to functional verification, in which increased complexity in a device is verified by simply increasing the number of tests that are simulated, is rapidly becoming infeasible. In addition, because the input to a simulator in a conventional verification process is simply a large number of deterministic tests or randomly generated tests, the output of the simulation must be painstakingly evaluated to determine whether a particular simulation was successful in testing the intended functionality of the device.

It would therefore be desirable to implement a test verification system that addressed the problems associated with design verification.

SUMMARY OF THE INVENTION

The problems identified above are addressed by an integrated circuit design verification system in which test verification information pertaining to a maximum number of time steps or the number of time steps that have been verified is propagated among multiple verification processes. Each process may update the time step information and forward it to a subsequent process. A verification process receiving time step information uses the information to reduce or simplify the amount of verification processes it performs thereby reducing the amount of resources required to perform the verification. Each verification process may be implemented as a discrete test verification engine designed to perform a specific verification task. One of the verification processes that may be employed is configured to determine an estimate of the maximum number of time steps that may be required to verify the circuit fully. The verification process may further be configured to propagate the number of time steps that have been verified in a forward and/or backwards direction. Verification processes receiving this information are freed from having to determine if a specified property is satisfied or violated during time steps that were enumerated by a preceding process. Moreover, processes can terminate verification entirely if the number of time steps verified exceeds the estimate of the maximum number of time steps required. By propagating this time step information, the invention beneficially reduces test verification resources.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention contemplates a system for verifying the design of an integrated circuit. A model of a particular integrated circuit is subjected to one or more verification processes, each of which typically emulates the circuit's functional behavior. The verification process is typically a cycle-based process in which the state of the circuit model is evaluated each cycle of a clock signal such that each clock cycle corresponds to a particular state or set of possible states. The verification process may be a formal process that fully enumerates the set of possible circuit states for each cycle checked.

Each verification process records the number of clock cycles, referred to herein as time steps, enumerated or verified in a forward direction (starting from an initial state of the circuit and proceeding forward) and/or in a backwards direction (starting from a "target" state and proceeding backwards to determine what, if any, initial state can lead to the destination state). This recorded information is then passed as a parameter to a subsequent verification process along with the verification problem definition and the circuit model. The subsequent process uses the cycle information to reduce its workload by simplifying its verification resources during time steps that were verified by a previous process. The simplification includes eliminating model checking during the cycles that were checked previously.

One or more verification processes in the system may also approximate a "diameter" for the integrated circuit model where the diameter represents an estimation of the maximum number of cycles required to fully verify the circuit. In such an embodiment, the diameter is passed among the various verification processes. Each process can use the diameter information to terminate itself when the number of cycles checked equals or exceeds the estimated diameter.

Using the time step information and/or the diameter information, the verification system can significantly reduce resource consumption during verification of a complex circuit. Although not required, verification systems that most benefit from recording and passing the verification information described herein are organized as a set of modular verification engines operating under a verification framework that enables user interaction. Accordingly, the embodiments of the invention described below employ a modularized verification engine architecture. It should be noted, however, that similar concepts may be applied to a more conventional or "flat" verification system having just a single identifiable process.

Figure 1:
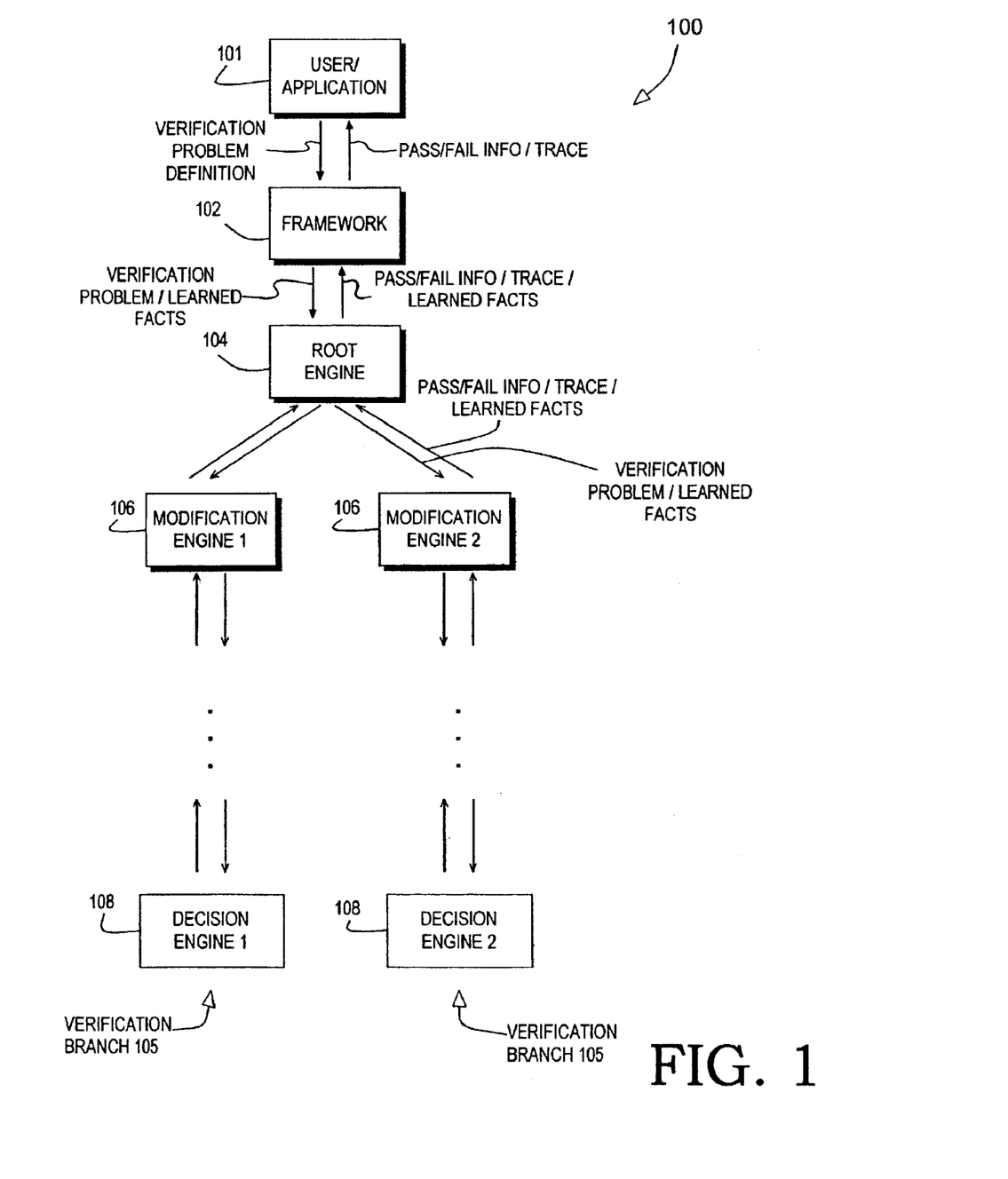
FIG. 1 is a block diagram illustrating a generalized design verification flow according to one embodiment of the invention.

Turning now to FIG. 1, a conceptual illustration of selected portions of a design verification system 100 suitable for use with one embodiment of the invention is presented. In the depicted embodiment, system 100 includes a design verification framework 102. Framework 102 typically includes an interface to communicate with one or more application programs 101 that are invoked by a system user. Framework 102 is further configured to provide a verification problem to a verification engine identified in FIG. 1 as root engine 104. The verification problem typically includes a netlist or another suitable representation of a circuit structure and a set of expected values at one or more of the circuit's nets that are to be proven or dis-proven. An expected value is proven if a state or sequence of states produces the expected value on the specified circuit net(s).

Framework 102 is configured to create instances of (instantiate) a set of verification engines in one or more sequences typically defined by the user via application program 101. The instantiated engines are typically arranged in a tree-like architecture having one or more verification branches from which other branches may split off. At the apex of this tree structure is a root verification engine 104 that receives a verification problem from framework 102. Framework 102 controls the flow of a verification problem among the verification engines in a branch.

As illustrated in FIG. 1, framework 102 is configured to interact with a user through application program 101 to create one or more verification branches 105, each of which includes a user-defined sequence of one or more verification engines represented in FIG. 1 by reference numerals 104, 106, and 108. Each verification engine is configured to model the operation (state changes) of an integrated circuit and to assess the model's adherence to one or more properties. The verification engines that may be instantiated or invoked by framework 102 include modification engines 106 and decision engines 108. As their names suggest, modification engines 106 are configured to modify (and presumably simplify) a given verification problem while decision engines 108 act on a modified or un-modified verification problem to attempt to solve the problem or provide other information about the circuit model.

Framework 102 is responsible for applying each of the one or more verification branches 105 to a verification problem. Within each branch 105, the verification problem may be modified by one or more modification engines 106 until, ultimately, the branch terminates with a "leaf" engine representing the last engine on a given branch. The leaf engine is typically a decision engine 108 that attempts to solve a verification problem.

After framework 102 has applied a verification branch 105 to a verification problem, the leaf engine has typically identified at least one counterexample trace for the original verification problem or proved that the problem has no solution. Assuming that the leaf engine in a particular branch 105 was successful in a solving particular problem (i.e., the leaf engine has generated at least one counterexample trace), it then passes the discovered trace to its parent engine. The parent engine is then responsible for modifying the received trace to reflect any modifications to the netlist that it made before it passed the netlist to the leaf engine. After modifying the trace, the parent engine then passes the modified trace to its parent engine, which further modifies the trace to reflect modifications it initiated and so forth until the trace is passed from root engine 104 back to the framework 102. In this manner, the trace passed back to framework 102 from each of the branches 105 will be consistent with the netlist generated by framework 102.

As indicated previously, framework 102 and the various verification engines are preferably compliant with a common API to facilitate the exchange of information passed from one engine to the next. In this embodiment, each verification engine must support a specified set of functions so that verification tasks will be handled in a consistent manner by each of the engines. The API, for example, may specify a function to create the logical AND of two nets in a netlist.

The verification engines may, during processing of a verification problem, learn certain verification related facts that may make it simpler for other engines to solve the verification problem(s). An engine that learns such a fact typically propagates the learned information to its parent and its child. Each of these modules, in turn, will pass the learned information to their respective parents and children. In this manner, the learned information is propagated throughout the tree arrangement. Thus, as illustrated in FIG. 1, the information passed from root engine 104 to each child engine 106 may include a verification problem as well as learned facts about the design. The information passed back from children engine 106 to root engine 104 may include pass/fail information, one or more counterexample traces, and learned facts.

Figure 2:
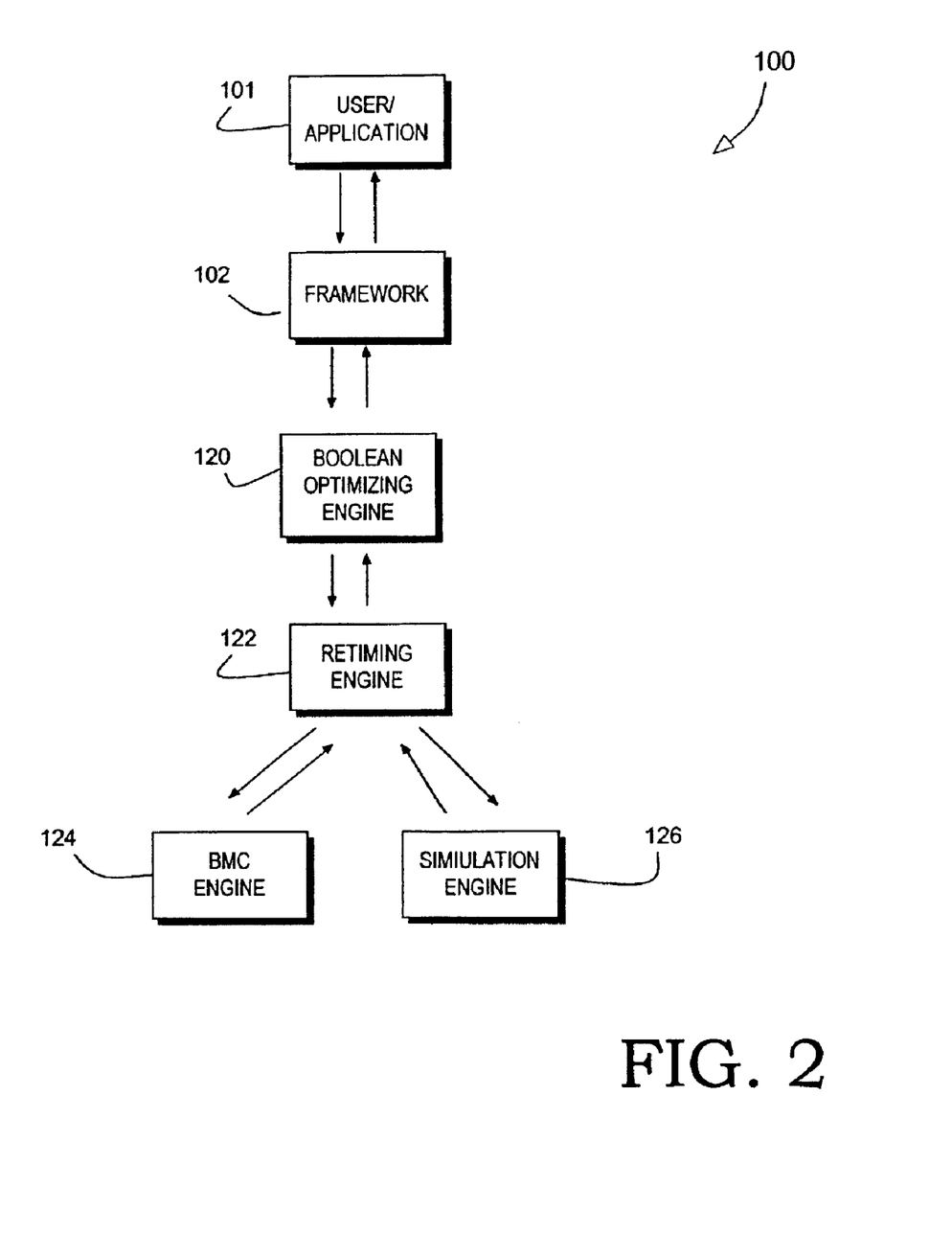
FIG. 2 is a block diagram illustrating an exemplary design verification flow according to the present invention.

Turning now to FIG. 2, additional detail of the generalized system described with respect to FIG. 1 is provided by way of an exemplary verification flow according to one embodiment of the invention. In the embodiment depicted in FIG. 2, an application/user invokes verification system 100 by specifying a verification problem to framework 102. Typically, the specification of the verification problem includes sending a netlist and set of expected values for specified nets. As an example, the verification problem may represent a query of whether a CHECKSTOP signal is ever asserted where the CHECKSTOP signal is designed to assert in response to a detected fault condition. In this example, verification system 100 is required to prove or disprove whether the specified signal (the single CHECKSTOP signal of this example) can attain a specified value (a logical "1"). If verification system 100 is able to demonstrate that the CHECKSTOP can be asserted, the system is expected to provide a counterexample trace depicting the sequence of values of the circuit nets on a cycle-by-cycle basis that leads to the failure. This trace may comprise a simulation-style of trace from an initial value of the circuit to any state in which the CHECKSTOP is asserted.

Framework 102 receives the netlist and the specified nets and expected values. Framework 102 may then instantiate a modification engine to attempt to simplify the problem before executing a decision engine. In the depicted embodiment, the invoked modification engine is a reduction engine in the form of a Boolean optimization engine (BOE) 120. Reduction engines such as BOE 120 attempt to simplify the problem by, for example, discovering functionally equivalent nodes in the netlist and merging them together. If BOE 120 is able to simplify the functional model of the circuit, it modifies the netlist accordingly and passes the modified verification problem to its child engine.

In the depicted example, the child engine of BOE 120, the modification engine identified as retiming engine 122 is an example of an abstraction engine. Abstraction engines such as retiming engine 122 may attempt to further simplify the verification problem by eliminating selected state-holding elements (latches or registers). The verification problem specified by retiming engine 122 is then passed to a pair of child engines along a respective pair of verification branches.

In addition to reduction engines and abstraction engines, modification engines 106 may include one or more decomposition engines. As their name suggests, decomposition engines are configured to modify a verification problem by breaking the problem down into two or more sub-problems. As a simple example, a decomposition engine may create two sub-problems, one for the case in which an input or signal is a "0" and another sub-problem for the case in which the input or signal is a "1."

Framework 102 then creates a pair of verification branches by invoking a pair of decision engines and instructing the retiming engine 122 to pass the modified verification problem to each decision engine. The first decision engines invoked by framework 102 is a Bounded model checking (BMC) engine 124 while the second decision engine invoked is a simulation engine 126. BMC engine 124 then performs a bounded model check of the netlist while simulation engine 126 is simultaneously performing a simulation of the test problem based upon a set of predetermined test cases. Thus, the depicted embodiment of verification system 100 is employed to execute a pair of decision engines simultaneously on a common verification problem. The BMC engine 124 typically performs a substantially exhaustive search covering a specified number of time steps. This search typically requires a considerable amount of execution time but provides a higher level of confidence with respect to the verification problem at hand. Simulation engine 126, on the other hand, may execute relatively quickly, but may not generate the same level of confidence if a counterexample is not found.

One or both of the decision engines depicted may determine that, if a certain internal net in the circuit assumes a certain value, the verification problem will ultimately be disproved. If, for example, the assertion of some internal net guarantees that the CHECKSTOP signal will be asserted, the internal net is said to be a "lighthouse" for the CHECKSTOP signal. The verification problem can be simplified by modifying the problem to look for an assertion of the lighthouse rather than the assertion of the specified net. The lighthouse may simplify a verification problem because it is easier to prove from a probability standpoint, or because the lighthouse is reachable at a shallower sequential depth than the specified net, or both. The discovery of a lighthouse is an example of a learned fact that the discovering verification engine can then communicate to its parent engine, namely retiming engine 122. Retiming engine 122 then passes the lighthouse or other learned fact(s) to its other child engine (BMC engine 124) and its parent BOE 120. Decision engines 124 and 126 will then attempt to discover a solution for the light house as well as for the originally specified problem thereby increasing the probability that a solution for one or the other problems will be discovered.

If one of the decision engines 124 or 126 discovers a solution to either an originally specified verification problem or to a lighthouse, the engine will build a trace (typically referred to as a counterexample trace) illustrating the sequence from an initial state to a state where the target is asserted. If simulation engine 126 is able to hit the lighthouse, it builds a trace indicating the path to the lighthouse and passes it to its parent, retiming engine 122. Because the lighthouse was discovered by BMC engine 124, which is a child of retiming engine 122, retiming engine 122 translates the trace to the problem domain that it passed to BMC engine originally, which is the same problem domain that retiming engine 122 passed to simulation engine 126 originally. BMC engine 124 receives the trace indicating the path to the lighthouse and, based on its previously discovered knowledge of how to transition from the lighthouse to the assertion of CHECKSTOP, BMC engine 124 will build the counterexample trace indicating how to transition from an initial state to the assertion of CHECKSTOP.

BMC engine 124 then passes this trace to back to retiming engine 122. Upon receiving the CHECKSTOP counterexample, retiming engine 122 will back-translate the received trace to account for any netlist modifications that retiming engine 122 made originally. Retiming engine 122 then sends the "un-retimed" CHECKSTOP trace to its parent BOE 120. BOE 120 will back-translate its received trace to un-merge any nodes that it merged originally and send the modified trace up to framework 102, which passes it on to user application 101. Framework 102 would then cancel the CHECKSTOP target in its root engine (BOE 120 in this example), which would propagate the cancellation of the target throughout the instantiated engines. If any targets remain unresolved, the system would continue to attempt to solve them.

Figure 3:
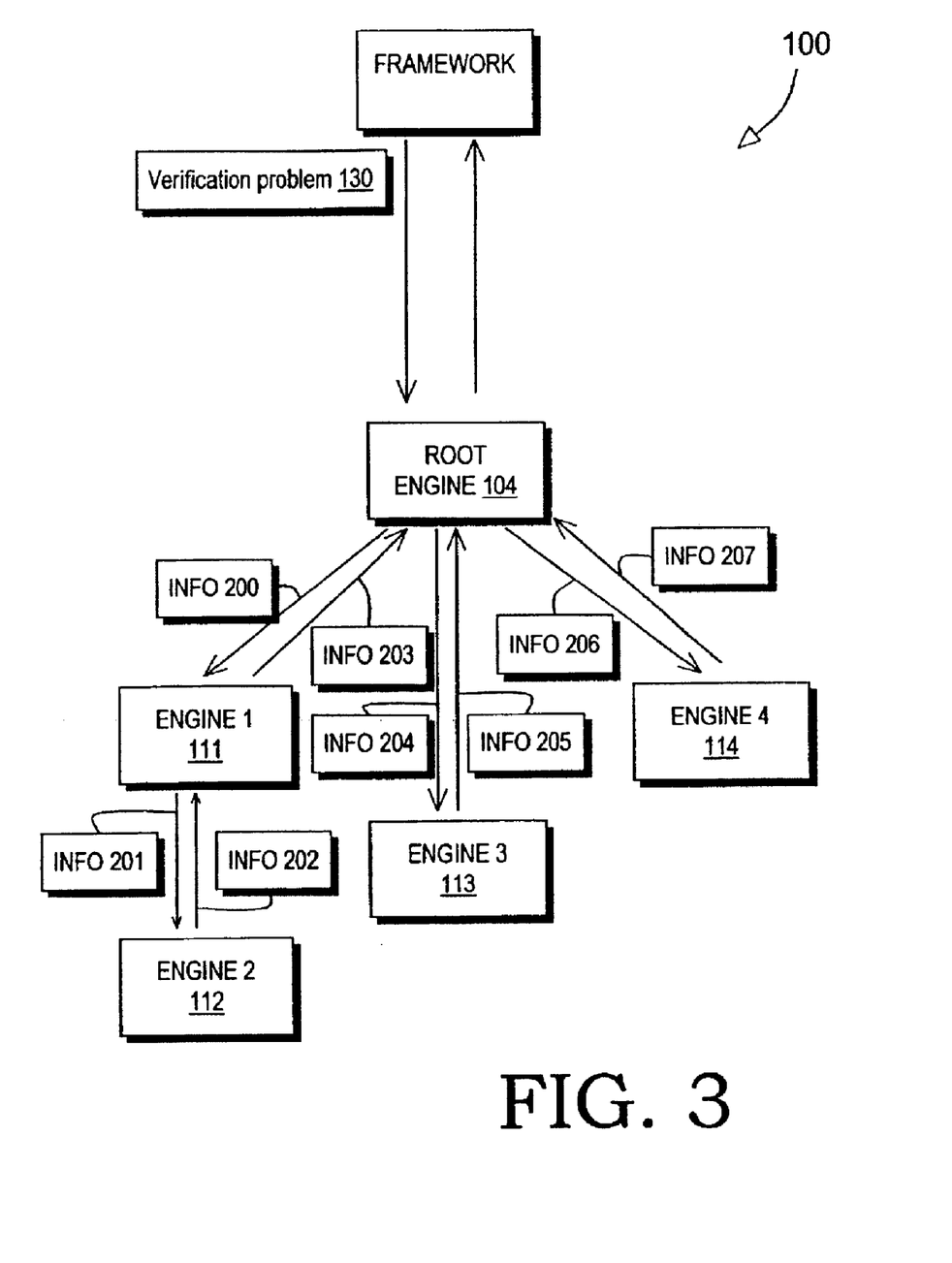
FIG. 3 is a conceptualized design verification system in which specific verification information is conveyed to and from modularized verification engines to simplify or shorten the verification process.

Referring now to FIG. 3, additional details of a modularized embodiment of a design verification system 100 are described. The elements of system 100 represented illustrated in FIG. 3 include the generation of time step information by some or all of the verification engines and the sharing of this information among the engines. To emphasize these elements, the embodiment of system 100 depicted in FIG. 3 has been simplified from the embodiments shown in FIGS. 1 and 2. As depicted in FIG. 3, includes a framework 102 and a root engine 104, and a set of four verification engines identified as Engine 1 (111), Engine 2 (112), Engine 3 (113), and Engine 4 (114). Each of the engines 110 through 114 is configured to model the operation of an integrated circuit. The verification engines are able to assess the model's adherence to one or more properties, which may be predefined or specified by a user. Engines 110 through 114 may be implemented as a modification engine or a transformation engine as described above. In addition, each of the verification engines 110–114 is specifically configured to receive and transmit a form of learned information corresponding to the design being verified that may be used by a subsequent engine to simplify or shorten the verification that it performs.

In one implementation, the information shared among verification engines 110–114 includes time step information and diameter information. The time step information may include forward time step information and/or backward time step information. The time step information indicates the number of forward or backward time steps that have been checked by another verification engine (or checked during a previous invocation of the current verification engine). The diameter information indicates a maximum number of or upper bound on the number of time steps that are required to exhaustively verify the functionality of the circuit model. Enumerating a model's states for time steps greater than its diameter produces no new states and is, therefore, redundant from a functional verification perspective.

Each verification engine 110–114 may receive time step and diameter information and perform a verification task whether it be a transformation task, a decision task, or a combination thereof. Each engine then alters the time step and diameter information if appropriate depending on the verification task performed, and transmits the updated information to the next engine.

Each engine uses the time step and diameter to eliminate redundant verification processing. Redundant verification processing includes checking for violation of a property during a time step that has been checked previously and emulating time steps that are "greater than" the maximum number of time steps required to fully verify the design. By eliminating this redundant verification processing, system 100 is capable of saving a potentially significant amount of verification resources.

To illustrate the elements being emphasized in the present disclosure, an exemplary verification process is described in conjunction with the embodiment of system 100 depicted in FIG. 3. A verification problem 130 is defined by the framework 102 and provided to root engine 104. Verification problem 130 includes some form of description for a design to be verified, a definition of the inputs under consideration, and a definition of a property or target to be verified. The design description is typically a net list, a VHDL description, or some other suitable description of the design.

Each engine 111–114 is configured to receive a verification problem such as verification problem 130 from another engine (the parent engine) and to perform its defined task on the problem when executed or run. In the depicted embodiment, root engine 104 is a parent engine to engines 111, 113, and 114. As described previously, the defined task for an engine could include transformation tasks in which the circuit model or verification task is simplified in some manner and decision tasks in which the existing model is checked within some defined parameters. The defined parameters typically include the number of time steps to check. In one embodiment, one or more of the verification engines 111–114 that perform decision tasks perform exhaustive, formal verification steps in which all states of the design under verification reachable during the defined set of time steps are enumerated.

Each engine 111–114 is further configured to pass a verification problem to another engine (its child engine) and to receive verification results back from its child when the child has completed its verification processing. Verification results can include counter-example traces, completed proofs that a target can never be asserted, learned facts, and/or time steps verified and design diameter estimation. Each engine 111–114 then passes the received verification results back to its parent. In the depicted embodiment, engine 112 is a child engine relative to engine 111 while engines 113 and 114 as depicted have no child engines. Thus, engine 111 is configured to receive data relating to a verification problem that has been processed by engine 112 and to pass the received data back up to root engine 104.

As suggested previously, engines 104 and 111–114 are configured to pass time step and diameter information among themselves as they pass a verification problem to one another. Similarly, time step and diameter information is propagated from a child engine to its parent. In such an implementation, one or more of the verification engines includes a diameter estimation engine. A diameter estimation engine is an engine that calculates a value that represents an upper bound on the number of time steps that would have to be fully enumerated to formally verify the design. Full enumeration refers to the process of emulating every possible state that a circuit can assume. A time step is fully enumerated when a verification engine evaluates every possible state that the circuit can assume during that time step.

A design's actual diameter represents a time step value beyond which no new states of the design can be encountered. To determine a design's actual diameter, it would typically be necessary to fully enumerate the design until no new states are found. Of course, if such an exhaustive verification were performed, the diameter information would be of little value since substantially everything "knowable" about the design will have been learned. Instead of determining the actual diameter, a diameter estimation engine according to the present invention is configured to determined an approximation of a circuit's diameter where the approximation is greater than or equal to the actual diameter. In other words, a diameter estimation engine according to the present invention provides an over estimation of the true diameter. The diameter estimation engine may use structural analysis to determine an approximate diameter or some form of semantic approach in which, for example, an approximate state space search is used to over estimate the true diameter.

The diameter estimation engine may be beneficially employed to obtain a useful diameter approximation in an efficient manner. A design having R "state holding" elements can assume a maximum of $2^R$ states. Thus, $2^R$ represents the roughest and simplest over estimation of the circuits diameter. Unfortunately, this is not a very useful diameter estimation and a diameter estimation engine implemented in FIG. 3 will generally determine a diameter that is substantially lower. The benefit achieved by using one or more decision engines to determine an approximate diameter is that subsequent decision engines will "know" that it is unnecessary to verify the design in time steps beyond the estimated diameter.

In addition to diameter information, one or more of engines 104, and 111–114 are configured to fully enumerate the integrated circuit model for a predetermined number of time steps. In addition, verification engines 104 and 111–114 are configured to propagate the diameter and time-steps-verified information to and from each other. Thus, each verification engine is configured to receive time step and diameter information that it can use to simplify the verification that it performs. Presumably, each verification engine either "improves" the time step and/or diameter information or leaves it alone. An improvement in time step information is an increase in the number of time steps verified whereas an improvement in diameter information is a decrease in the estimated diameter because it is desirable to increase the number of time steps verified and to reduce the estimate of the maximum number of time steps required.

Each verification engine may use the time step and diameter information to minimize verification resources. As an example, a circuit property can be inferred as correct if the number of exhaustive time steps verified exceeds the estimated diameter. The number of time steps exhaustively verified can include a forward time steps component and a backwards time steps component. In this case, it is only necessary that one of the component time steps exhaustively verified exceeds the estimated diameter. Another example of verification resource reduction occurs when an exhaustive search algorithm is invoked. The algorithm need not check for the truth or falsity of a specified property during the time steps already checked (i.e., during time steps with values that are less than the greater of the time steps forward information and the time steps backward information). Thus, if 6 time steps have been exhaustively verified forwards while 10 time steps have been exhaustively verified backwards, a subsequent engine need not verify circuit properties during time steps 0 through 9.

Referring again to FIG. 3 to illustrate the use and propagation of the time step and diameter information, framework 102 transmits a verification problem in which the DIAMETER is estimated as VERY LARGE (e.g., $2^R$) and the forward (FWD) and backward (BCK) TIME STEP parameters are initialized to 0. As each engine in system 100 is invoked, it will internally update its record of these three parameters as appropriate. When an engine subsequently passes the problem to a child engine, the parent engine will propagate the current values of the parameters to the child. Similarly, when an engine receives verification data (including these three parameters) back from its child, it will update its internal values for these parameters appropriately (i.e., to record the DIAMETER reported by the child if that value is smaller than its previously-held value, and to record the FWD and BCK TIME STEP values reported by the child if those values are larger than their previously held values). The engine will then propagate any improvements in these parameters (lower DIAMETER, higher FWD or BCK TIME STEP) up to its parent (root engine 104 in the depicted example). Ultimately, the framework 102 will archive the best determined values for the parameters. If a subsequent run is executed, the execution will start with the archived parameter values as the initial values.

In the depicted flow, root engine 104 is a transformation engine that modifies and, presumably, simplifies the model of the design. The model generated by root engine 104 is passed to Engine 1 (111) along with the time step information (INFO) represented by reference numeral 200. Engine 1 (111) may be another transformation engine that performs a bounded backward exhaustive search for 6 time steps. The backwards search is performed in an effort to assess the incorrectness of a property during its transformation. Assuming that the problem is not solved, within the 6 time steps, the circuit model output from Engine 1 is passed to its child engine, Engine 2 (112), along with INFO 201. At this point, INFO 201 indicates that the maximum number of backwards time steps is 6, while the number of forward time steps and diameter still retain their default (initial) values of 0 and $2^R$ respectively.

Engine 2 (112) may be a verification engine that performs a bounded exhaustive forward search for 20 time steps. While performing this verification processing, Engine 2 (112) makes use of INFO 201 by not checking for property violations during its enumeration of time steps 0 through 5. If Engine 2 (112) is unable to prove or disprove a property within its 20 time steps, it updates the time step information with 20 as the number of time steps forward and passes this information back to Engine 1 (111) as INFO 202, where FWD is 20, BCK is 6, and the estimated diameter is still $2^R$. Engine 1 (111) propagates INFO 203 back to root engine 104 where INFO 203 is the same as INFO 202.

Root engine 104 then passes the existing time step information (INFO 204) to Engine 3 (113). Engine 3 is, for purposes of this example, a diameter over approximation engine that estimates the diameter of the circuit under verification to be no greater than 30. This information is then incorporated into INFO 205 and returned to root engine 104 with FWD=20, BCK=6, and DIAMETER=30. Root engine 104 then passes the time step information (INFO 206) to Engine 4 (114), which is exemplified by another verification engine. If Engine 4 is requested to perform a bounded exhaustive forward search for 40 time steps, INFO 206 is used to eliminate property checking during time steps less than 20 (because of the value of FWD) and time steps greater the 30 (because of DIAMETER). Thus, in this example, Engine 4 is required only to check for property violations during time steps 20–2. If a property is not violated during these times, it can be assumed that the design cannot be violated under any circumstances even though a relatively small number of bounded exhaustive steps have been performed. After performing its requested task, Engine 4 (114) returns INFO 207 to the root engine with FWD=30, BCK=6, and DIAMETER=30. In addition, Engine 4 may report that the corresponding property cannot be violated and, therefore, that the property has been proven.

It will be appreciated that, in the foregoing example, Engines 2 and 4 did not waste resources checking for violations during time steps previously verified. Nor did Engine 4 have to waste resources checking properties during time steps higher than the over estimated diameter. In the end, the amount of resources used was minimized, but the design was fully verified nevertheless. In addition, this complete verification was performed using a variety of algorithms, including arbitrary mechanisms for diameter over-approximation, arbitrary bounded forward and backward search algorithms (which are themselves either exact or approximate), and possibly, though not necessarily, unbounded formal algorithms to enumerate all reachable states of a design.

Portions of the invention may be implemented as a set of computer executable instructions (i.e., software) stored on a computer readable medium such as a dynamic or static RAM element, a non-volatile medium such as a magnetic disk, CD ROM, floppy diskette, flash memory, magnetic tape, and so forth. In one such implementation, the software, when executed, performs an integrated circuit design verification method 140 depicted in the flow diagram of FIG. 4. The N and DIAMETER parameters are initialized (block 139) to their initial value of 0 and $2^R$ respectively, where R indicates the number of state-holding elements in the circuit. After initializing the time step parameters, a first verification process or engine enumerates (block 141) a certain number of time steps and adjusts the value of N accordingly. Thus, if four time steps are enumerated, the value of N is set to 4. In the depicted embodiment, the first verification engine does not estimate the integrated circuit's diameter and, accordingly, the value of diameter is left unaltered. In accordance with the present invention, the first verification engine then propagates (block 142) the time step information to a second process or engine.

Figure 4:
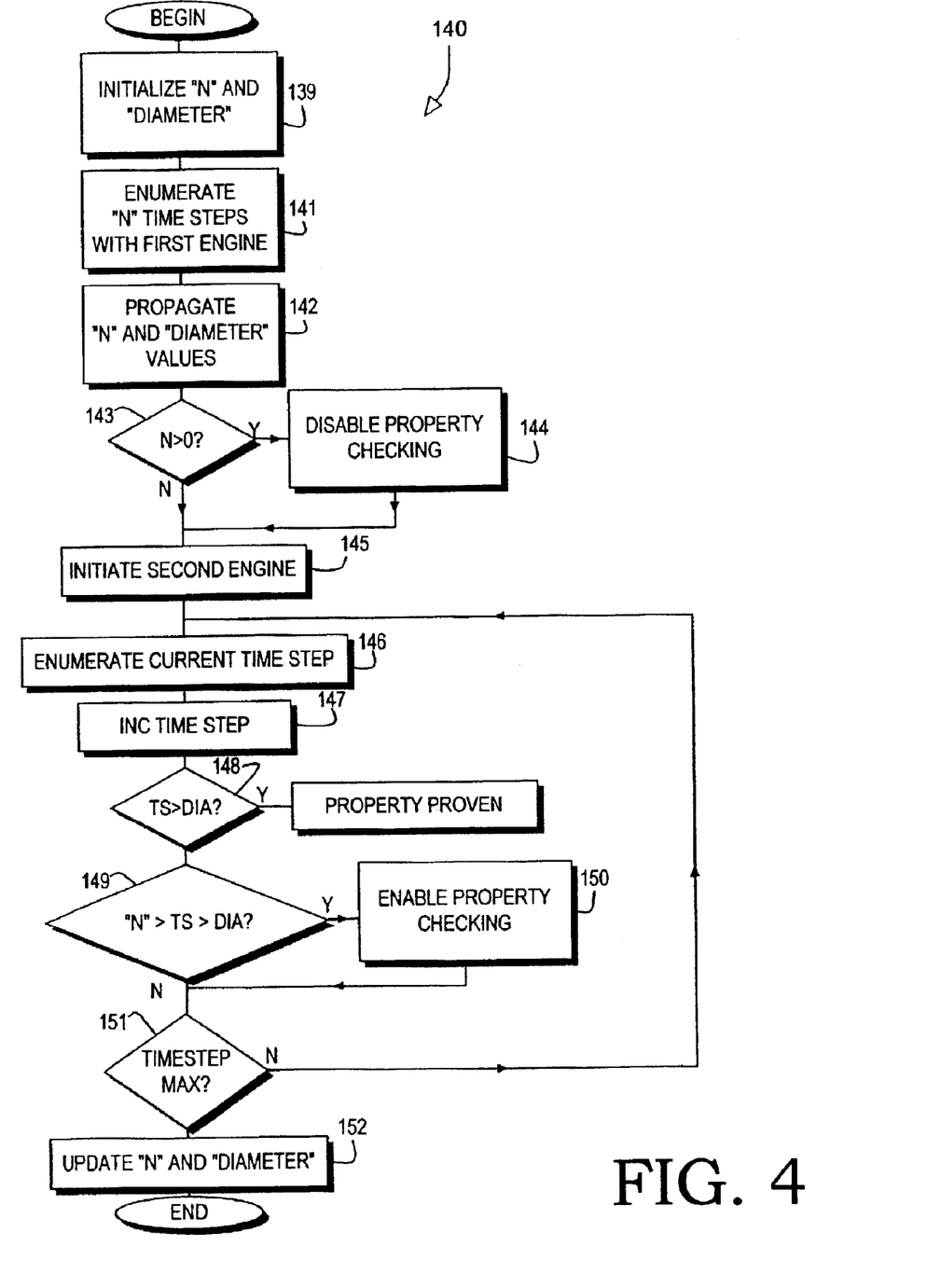
FIG. 4 is a flow diagram illustrating a method for verifying the design of an integrated circuit.

The second engine, which receives the time step information, determines (block 143) whether the value of N it has received is greater than 0. If N is greater than 0, the second engine can assume that the first engine (or some other previously executed verification process) has fully enumerated the N cycles of the integrated circuit model. Because time steps 1 through N have been enumerated and assess for proper behavior, the second verification engine can save verification resources by disabling (block 144) property checking for the first N cycles. In other words, because the second verification engine knows how many time steps have been enumerated and verified, it can ignore that many times steps for purposes of assessing the circuit's adherence to the defined property or properties.

After determining whether to disable property checking, the second verification engine is initiated (block 145) with the time step value reset to 0 (while N remains at the value propagated by the first engine). The second engine enumerates a time step (block 146) and increments (block 147) the time step value. If (block 148) the time step value (TS) is greater than DIAMETER, the property under consideration has been proven thus implying that no more work needs to be done. Otherwise, the time step value is then compared (block 149) against the N and DIAMETER values. If the time step is greater than N (meaning that the engine has cycle past the previously enumerated time steps) and less than DIAMETER (meaning that the time steps have not reached the point at which subsequent time steps are redundant), then property checking is enabled (block 150) and the engine enumerates the next time step in block 146. This process repeats until (block 151) some maximum time step value is achieved, at which point the second verification engine then updates (block 152) the values of N and DIAMETER. These updated values are then propagated to the next engine and so forth. Implied in this description is the fact that some verification engines may update or modify the N parameter (using either forward or backward search algorithms) while others may modify the DIAMETER parameter while still others may modify both.

It will be apparent to those skilled in the art having the benefit of this disclosure that the present invention contemplates a method and system for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A design verification system, comprising:
    a first verification engine configured to enumerate N time steps of a model of an integrated circuit, to assess the model's adherence to a property during the N time steps, and to propagate the value of N;
    a second verification engine configured to receive the value of N and perform subsequent analysis of the model including enumerating states of the model for time steps less than N and verifying the model's adherence to the property during time steps greater than N wherein the second verification engine is configured to omit property violation checking when enumerating times steps less than N.

2. The system of claim 1, further comprising a third engine to estimate a diameter of the integrated circuit, wherein the diameter represents a value of N beyond which subsequent modeling of the integrated circuit produces no new states.

3. The system of claim 2, wherein the second verification engine is configured to omit property violation checking and state enumeration for time steps greater than the estimated diameter.

4. The system of claim 1, wherein N is indicative of a number of cycles verified using a forward search algorithm and a number of cycles verified using a backward search algorithm.

5. The system of claim 1, wherein the second verification engine is further configured to enumerate states and verify the model's adherence to the property during time steps less than M, where M is greater than N, and further wherein the second verification engine is configured to propagate the value of M back to the first verification engine.

6. The system of claim 1, wherein at least one of the verification engines comprises a transformation engine configured to simplify the integrated circuit model.

7. The system of claim 1, wherein the first verification engine includes a forward search algorithm and wherein N represents the number of time steps enumerated by the first verification engine in a forward direction.

8. The system of claim 7, wherein the second verification engine includes a backward search algorithm configured to propagate a value M wherein M represents the number of time steps enumerated by the second verification engine in a backward direction.

9. A computer program product comprising computer executable instructions, stored on a computer readable medium, for verifying the design of an integrated circuit, comprising:
    computer code means for enumerating, with a first verification engine, N time steps of a model of an integrated circuit, assessing the model's adherence to a property during the N time steps, and propagating the value of N;
    a computer code means for receiving, by a second verification engine, the value of N and performing subsequent analysis of the model including enumerating states of the model for time steps less than N and verifying the model's adherence to the property during time steps greater than N wherein the second verification engine is configured to omit property violation checking when enumerating times steps less than N.

10. The computer program product of claim 9, further comprising computer code means for estimating a diameter of the integrated circuit, wherein the diameter represents a value of N beyond which subsequent modeling of the integrated circuit produces no new states.

11. The computer program product of claim 10, wherein the second verification engine is configured to omit property violation checking and state enumeration for time steps greater than the estimated diameter.

12. The computer program product of claim 9, wherein N is indicative of a number of cycles verified using a forward search algorithm and a number of cycles verified using a backward search algorithm.

13. A design verification system method, comprising:

enumerating, with a first verification engine, an integrated circuit model for N time steps and checking the model's adherence to a property;

recording N;

forwarding the value of N to a second verification engine; and enumerating the model with the second verification engine for time steps greater than N, wherein the second verification engine ignores the model's adherence to the property for time steps less than N and checks the model's adherence to the property for time steps greater than N.

14. The method of claim 13, further comprising estimating a diameter of the integrated circuit by estimating a number of time steps beyond which subsequent enumeration produces no new states.

15. The method of claim 14, further comprising, ignoring the model's adherence to the roperty for time steps greater than the estimated diameter.

16. The method of claim 15, wherein enumerating states of the integrated circuit model with the first verification engine is further characterized as enumerating the integrated circuit model with a forward search algorithm and further wherein enumerating states of the integrated circuit model with the second verification engine is further characterized as enumerating the integrated circuit with a backward search algorithm.

* * * * *